United States Patent [19]

Shannon

[11] 4,149,174
[45] Apr. 10, 1979

[54] MAJORITY CHARGE CARRIER BIPOLAR DIODE WITH FULLY DEPLETED BARRIER REGION AT ZERO BIAS

[75] Inventor: John M. Shannon, Whyteleafe, England

[73] Assignee: U.S. Philips Corporation, New York, N.Y.

[21] Appl. No.: 780,004

[22] Filed: Mar. 22, 1977

[30] Foreign Application Priority Data

Mar. 24, 1976 [GB] United Kingdom ............... 11835/76

[51] Int. Cl.$^2$ .......................................... H01L 29/90
[52] U.S. Cl. ......................................... 357/13; 357/15; 357/34; 357/90; 357/91
[58] Field of Search ................... 357/4, 13, 15, 16, 33, 357/34, 90, 91

[56] References Cited

U.S. PATENT DOCUMENTS

| | | | |
|---|---|---|---|
| 3,488,527 | 1/1970 | Ruegg | 357/13 |
| 3,615,929 | 10/1971 | Portnoy et al. | 357/34 |
| 3,814,993 | 6/1974 | Kennedy | 357/16 |
| 3,823,352 | 7/1974 | Pruniaux et al. | 357/91 |
| 3,940,783 | 2/1976 | Polata | 357/13 |
| 3,943,552 | 3/1976 | Shannon et al. | 357/13 |
| 3,964,084 | 6/1976 | Andrews et al. | 357/15 |

*Primary Examiner*—Joseph E. Clawson, Jr.
*Attorney, Agent, or Firm*—Thomas A. Briody

[57] ABSTRACT

A majority charge carrier diode structure in which current flow between two regions of the same conductivity type is controlled by the number of compensating impurities implanted to form between the two regions a narrow, fully-depleted barrier region which presents a potential barrier to each region. The device can be used as a discrete diode or as part of a device e.g. the collector junction of a transistor.

16 Claims, 10 Drawing Figures

MAJORITY CHARGE CARRIER BIPOLAR DIODE WITH FULLY DEPLETED BARRIER REGION AT ZERO BIAS

This invention relates to a semiconductor device comprising a semiconductor body including first and second semiconductor regions of one conductivity type separated by a barrier region having a net activator concentration of the opposite conductivity type, a current path in the device between said first and second regions across said barrier region, the current flow through said barrier region being by charge carriers of said one conductivity type and the first region having a higher doping concentration of the one conductivity type than the second region.

The invention further relates to methods of manufacturing such semiconductor devices. Such semiconductor devices can be manufactured with characteristics for use in, for example, rectifying, amplifying, logic, or opto-electronic applications.

A semiconductor device as described above is known from U.S. Pat. No. 3,940,783.

It is well known to form potential barriers in semiconductor devices as either p-n junctions or Schottky barriers. Such potential barriers are used in semiconductor diodes, transistors and other semiconductor devices including integrated circuits.

The p-n junction as fabricated and used in known semiconductor devices forms a potential barrier in a semiconductor body between two semiconductor regions of opposite conductivity type; apart from a narrow depletion layer at the p-n junction, both these semiconductor regions of opposite conductivity type are not depleted of mobile charge carriers, at least at zero bias voltage across the junction. When a current flows through the structure under forward or reverse bias conditions the current crossing the junction into one of the two regions is by charge-carriers of opposite conductivity type to that region, i.e. by minority charge carriers. As is well known in the semiconductor art, such a use of minority carriers can be disadvantageous for many devices, for example, due to minority charge carrier storage effects, slow switching speeds and a comparatively high forward voltage drop.

In many device applications it is therefore known to use a Schottky barrier instead of a p-n junction. A Schottky barrier is a metal-semiconductor junction formed between an electrode and a semiconductor region of one conductivity type which is contacted at the surface by the electrode; apart from a narrow depletion layer at the Schottky barrier, the semiconductor region is not depleted of mobile charge-carriers of the one conductivity type at least at zero bias, and the current flow through the structure under bias conditions is by charge-carriers of the same conductivity type as said region, i.e. by majority carriers. Schottky diodes can therefore be formed having negligible minority carrier storage, high switching speeds and low forward voltage drops. However, Schottky barriers have the disadvantage of being formed at a semiconductor body surface. The height of the potential barrier between the semiconductor and metal is affected by the surface states and general condition of the semiconductor surface. Above all, Schottky barrier technology is not suitable for forming potential barriers in the bulk of a semiconductor body, which restricts the possibilities of integrating Schottky barriers in semiconductor device structures.

Under activators there should be understood in this specification not only the usual donor and acceptor atoms but also vacancies, crystal imperfections, deep level impurities and all other kinds of activator centers determining p- or n-type conductivity.

According to a first aspect of the present invention, there is provided a semiconductor device comprising a semiconductor body including first and second semiconductor regions of one conductivity type separated by a barrier region having a net activator concentration of the opposite conductivity type, a current path in the device between the first and second regions across the barrier region, the current flow through the barrier region being by charge carriers of the one conductivity type and the first region having a higher doping concentration of the one conductivity type than the second region. The barrier region is sufficiently thin that the depletion layers formed at zero bias with both the first and second regions merge together in the barrier region to substantially deplete at zero bias the whole barrier region of mobile charge carriers of both of the one and opposite conductivity types.

U.S. Pat. No. 3,940,783 discloses a rectifier and voltage reference semiconductor device structure in which the principal current flow is by majority carriers. The device comprises a p-type semiconductor layer between two n-type semiconductor regions also in the form of layers; the p-type layer forms two p-n junctions with the two n-type regions and has a typical thickness of 1 micron ($10^4$ Å). Voltage means is applied between the two n-type regions and thus across the p-type layer, a significant thickness of which at zero bias voltage is not depleted of holes. The magnitude of the bias voltage is increased during operation to cause one of the depletion layers formed at one of the two p-n junctions to spread through the thickness of the p-type layer so that eventually this spreading depletion layer extends across the whole thickness of the p-type layer, substantially depleting the whole of this layer and interconnecting the two n-type regions. In this condition, current flow of majority carriers occurs between the n-type regions. However, because it is necessary in this device structure to use bias voltage to deplete the whole p-layer, such a device used as a rectifier has a soft current-voltage turn-on for its forward characteristic with a significant forward voltage drop. This can degrade the asymmetry in its forward and reverse current-voltage characteristics, and can restrict its useful application in other contexts. Thus, for example such an n-p-n barrier structure requiring bias-voltage depletion would not be very suitable for use as a barrier of a more complex multi-barrier device structure such as, for example, a transistor, which use of such structure this U.S. Patent makes no reference to and gives no indication of. Furthermore, because it is necessary to use bias voltage to deplete the whole p-type layer, the device of U.S. Pat. No. 3,940,783 will not have negligible minority carrier storage effects and will not have a high switching speed.

By providing between such first and second regions such a thin barrier region the whole thickness of which is already substantially depleted at zero bias, a potential barrier structure is obtained which even at very low bias voltages has the appearance of a potential barrier at the interface of an n-n or p-p structure, instead of p-n junctions at the interfaces between n and p type regions in a n-p-n or p-n-p structure. Such a potential barrier between such first and second regions of a device in accordance with the invention can be represented as a potential peak or hump in a bulk portion of the semiconductor body and controls the current flow between the first and second regions. This current flow is by charge-carriers of the one conductivity type, i.e. by majority carriers on both sides of the potential barrier. Thus, devices in accordance with the invention can have negligible minority carrier storage effects and a high switching speed.

By having a very thin, substantially depleted barrier region with a high net impurity concentration and by having a very high doping concentration for the first region, the potential barrier so obtained between the first and second regions can have considerable asymmetry between its forward and reverse current-voltage characteristics. Thus, its forward characteristic can have a sharp turn-on at a low forward voltage drop.

In particular, such a thin barrier region which is already substantially depleted at zero bias can be readily used to provide in a compact manner one or more barriers of a multi-barrier semiconductor device or semiconductor circuit element, such as, for example, a form of transistor having a base region which is of the one conductivity type and the current flow through which is by majority charge carriers.

The height of the potential barrier between the first and second regions (and hus the magnitude of the current flow across the barrier region for a given bias voltage) is related to the magnitude of the activator concentration characteristic of the opposite conductivity type in the barrier region. Such an activator concentration may be formed by introducing into the semiconductor crystal lattice, radiation damage which has energy levels characteristic of the opposite conductivity type in the semiconductor; such damage centers may be formed by, for example, implantation of neutral ions. However, in a presently preferred form, the barrier region is a semiconductor region doped with doping atoms of the opposite conductivity type; such doping permits the barrier region to have a more easily reproducible and very high activator concentration of the opposite conductivity type.

The first, second, and barrier regions may form part of a semiconductor diode, a transistor or other type of semiconductor device, including an integrated circuit. Depending on the dopings and thicknesses chosen for the various regions of such devices a wide range of characteristics can be obtained from semiconductor devices in accordance with the present invention. In particular, devices and circuit elements can be obtained having a low forward voltage drop, low reverse leakage current and a fast response.

Semiconductor devices in accordance with the present invention can be manufactured using various techniques. However, it is particularly convenient to use ion implantations to form at least the barrier region. Thus, according to the invention there is also provided a method of manufacturing a semiconductor device according to the invention, in which the barrier region is formed by implanting into a semiconductor body portion of one conductivity type, through a semiconductor body surface ions of an activator determining said opposite conductivity type, the energy of the implanted ions being chosen to provide a maximum concentration of the activator at a depth in said body spaced from the surface.

Embodiments of the present invention which illustrate further features of the invention and their advantages will now be described by way of example, with reference to the accompanying diagrammatic drawings, in which.

It should be understood that the drawings are only diagrammatic, and that, in particular, in the drawings of the device structures, various thicknesses have been shown exaggerated for the sake of clarity, whereas others have been reduced for the sake of convenience.

Reference will first be made, by way of introduction, to FIGS. 1 and 2 which relate to structures not in accordance with the present invention.

Figure 1:
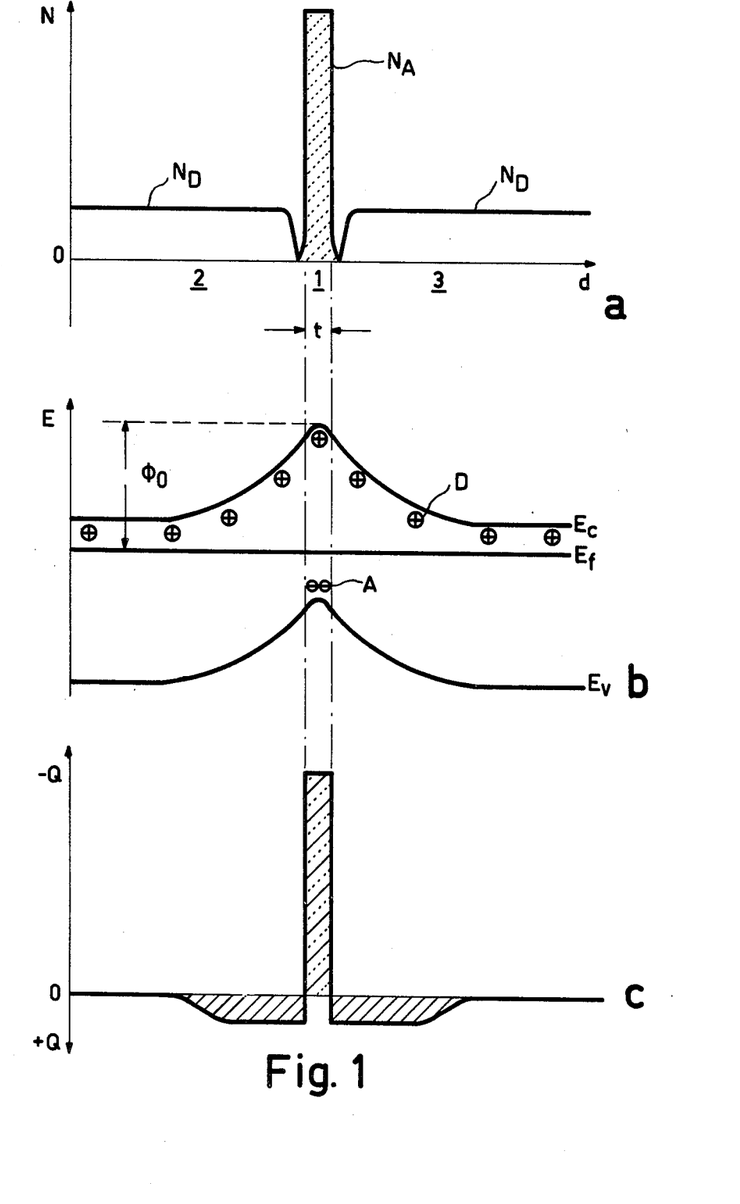
FIGS. 1(a)–1(c) show the variation with depth of the net doping levels, electron energy and space charge for a prior art semiconductor structure with a thin region comprising acceptors in an n-type semiconductor body portion, in thermal equilibrium.
Figure 2:
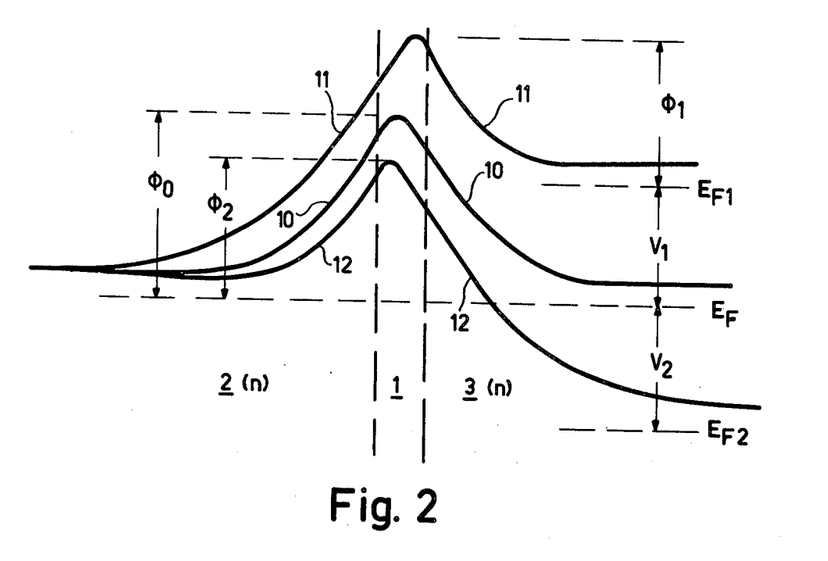
FIG. 2 is the potential diagram of a semiconductor device which is not in accordance with the present invention and has a region structure similar to that of FIG. 1.

FIG. 1 illustrates a simplified situation where a small number of acceptor atoms A are introduced into the bulk of an n-type semiconductor body portion of a substrate having a uniform doping concentration $N_D$ to form a thin region 1 having a net acceptor concentration $N_A$ separating regions 2 and 3 of the substrate. FIG. 1(a) shows the net acceptor or donor concentration N as a function of depth $d$ in the substrate. FIG. 1(b) is the corresponding electron energy diagram showing the energy band gap between the valence band edge $E_V$ and the conduction band edge $E_C$, together with the Fermi level $E_F$ and the energy levels of the acceptors A adjacent $E_V$ and of the donors D adjacent $E_C$. FIG. 1(c) shows the space charge distribution Q.

In the region 1 separating the n-type regions 2 and 3, the donor concentration has been overcompensated by a high concentration of acceptor impurity. However all the activators in the narrow region 1 are depleted by the merging of the depletion layers formed naturally at the junctions 2-1 and 1-3 at zero bias. This results in the negative space charge shown throughout region 1 in FIG. 1(c).

As commonly understood in the semiconductor art, a semiconductor region (such as the region 1) is said to be substantially depleted of charge carriers of both conductivity types when the number of mobile charge carriers of both conductivity types is negligible (usually for example at least two orders of magnitude less) compared with that of the net activator concentration in said region.

The presence of the negative space-charge region illustrated in FIG. 1(c) introduces band bending as shown in FIG. 1(b), and a barrier to electron flow results. The height of this barrier is represented by $\phi_0$ in FIGS. 1(b) and 2.

Thus, the substantially depleted region 1 provides potential barriers $\phi_0$ to the flow of electrons from both the first and second n-type regions 2 and 3 of the substrate. FIG. 2 is a potential diagram which follows the conduction band edge and illustrates the behaviour of such a structure with opposite bias voltages applied between electrode connections to the first and second regions 2 and 3. The potential curve 10 illustrates the situation without the application of any bias voltage between the regions 2 and 3. The potential curves 11 and 12 are for when the region 3 is biased respectively negatively ($V_1$) and positively ($V_2$) with respect to the region 2. $V_1$ and $V_2$ represent respectively the negative and positive bias voltages measured relative to the Fermi level $E_F$ at zero bias. $E_{F1}$ and $E_{F2}$ represent respectively the Fermi levels with negative and positive bias voltages $V_1$ and $V_2$. The barrier at zero bias voltage is $\phi_0$. This barrier is reduced by the application of positive bias voltage $V_2$. The potential barrier for electrons from region 3 under bias voltage $V_1$ is represented by $\phi_1$. The potential barrier for electrons from region 2 under bias voltage $V_2$ is represented by $\phi_2$. Both $\phi_1$ and $\phi_2$ are less than $\phi_0$. Because the doping concentration of region 2 is the same as that of region 3 $\phi_1$ equals $\phi_2$ when $V_1$ equals $V_2$. This would result in a symmetrical device which will turn-on in both bias directions at substantially the same value of $V_1$ and $V_2$.

Figure 3:
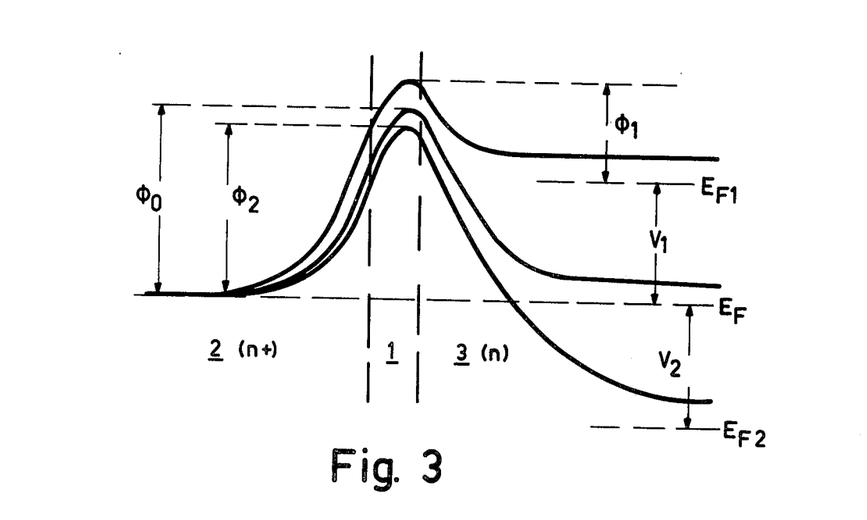
FIG. 3 is a potential diagram for a semiconductor device in accordance with the present invention.

A non-symmetric device in accordance with the present invention is illustrated in FIG. 3. This device structure has a substantially depleted barrier region 1 which is similar to that of FIGS. 1 and 2 and separates first and second regions 2 and 3 both of which are of one conductivity type, for example n-type. However in this device structure, the first region 2 has a higher doping concentration (n+) of the one conductivity type than has the second region 3. A current path defined by electrode connections to regions 2 and 3 is present between the first and second regions 2 and 3 through the barrier region 1. The current flow through the barrier region 1 is by charge carriers of said one conductivity type (i.e. electrons with n-type regions 2 and 3).

The barrier region 1 is a semiconductor region having a net activator concentration of the opposite conductivity type so as to provide the potential barriers to the flow of charge carriers of the one conductivity type from both the first and second regions 2 and 3, respectively and to form depletion layers at zero bias with both the first and second regions 2 and 3. The barrier region 1 is sufficiently thin that said depletion layers formed at zero bias with both said first and second regions 2 and 3 merge together in the barrier region 1 to substantially deplete at zero bias the whole of said barrier region 1 of mobile charge carriers of both said one and opposite conductivity types. Apart from the depletion layers formed with region 1, regions 2 and 3 remain undepleted at zero bias.

An approximate solution of Poisson's equation in this situation gives:

$$\phi_0 \approx q.N_s.t./2\epsilon.\epsilon_o. \quad (1)$$

where $q$ is the charge on an electron,
$\epsilon_o$ is the permittivity of free space,
$\epsilon$ is the relative permittivity of the semiconductor material,
$\phi_0$ is the potential barrier, under zero bias conditions, for electrons crossing from region 2 to region 3,
$t$ is the thickness of the barrier region 1, and
$N_s$ equals $(t.N_A)$ and is the net space charge density in the barrier region 1.

Because $N_s$ corresponds to the net impurity of said opposite type per unit area of the barrier region 1, it can be related to, for example, impurity ion doses which may be implanted to form such a barrier region 1.

For significant band bending to occur, $\phi_0$ should be greater than, for example, $kT/q$, where $k$ is Boltzmann's constant and T is the absolute temperature. Therefore, from equation (1), for a thickness $t$ of for example 100 Å, $N_S$ should be greater than approximately $2 \times 10^{11}$ impurity atoms per cm$^2$.

However, if the Fermi level $E_F$ were to come within a few $kT$ of the valence band edge $E_V$ in the barrier region 1, the barrier region 1 would no longer be depleted of mobile charge carriers of the opposite conductivity type so that p-n junction formation would occur. This limits the maximum value of $\phi_0$ for that semiconductor, and sets an upper limit on the permissible magnitude of $N_s$ for a given value of $t$. Thus, from equation (1), for a silicon semiconductor body, the value of $N_s$ should be less than approximately $2 \times 10^{13}$ impurity atoms per cm$^2$ for a barrier region thickness $t$ of 100 Å in order to maintain that region substantially depleted.

Returning now to FIG. 3, the n-type region 2 is more highly doped (n+) with donors than the n-type region 3. As a result the barrier $\phi_1$ to electrons from region 3 under bias voltage $V_1$ (region 3 biased negative with respect to region 2) is less than the barrier $\phi_2$ to electrons from region 2 under bias voltage $V_2$ (region 3 biased positive with respect to region 2 by $V_2$ of equal magnitude to $V_1$). Thus, the device will turn-on and conduct current at a lower voltage when region 3 is biased negative with respect to region 2 than when it is biased positive. Typically, the turn-on for negative bias ($V_1$) may occur at leas than 1 volt (the electrons flowing from n-type region 3 through barrier region 1 to n-type region 2), whereas the turn-on for positive bias ($V_2$) may occur at more than 10 volts (the electrons flowing from n-type region 2 through barrier region 1 to n-type region 3). The actual values of $V_1$ and $V_2$ for turn-on are determined by the asymmetrical doping chosen for the regions 2 and 3. The doping concentration of the first region 2 may easily be made at least 2, or 3, or even 4 orders of magnitude higher than that of the second region 3.

The activator of the barrier region 1 may be a shallow-level dopant of opposite conductivity type to said one conductivity type of the first and second regions 2 and 3. Such a shallow-level dopant forms a shallow energy-level in the band gap of the semiconductor material adjacent the opposite edge of the band gap to a dopant of said one conductivity type. However, the barrier region 1 may instead be doped with a deep-level impurity of said opposite conductivity type. Such an impurity has an energy level deep in the band gap away from both the edges $E_C$ and $E_V$ of the band gap and towards its middle. A possible advantage of using such a deeper level impurity as an activator is that by providing a sufficiently high doping the potential barrier can approach a value corresponding to the deep energy level of the impurity which value is insensitive of the magnitude of the deep-level doping.

For a given thickness $t$, the number $N_s$ of activator atoms of the opposite conductivity type in the barrier region 1 generally determines the height of the potential barrier $\phi_O$ between the first and second regions 2 and 3, and thus the magnitude of the current flow across the barrier region 1 for a given bias voltage. In order to obtain maximum asymmetry in the characteristics it is advantageous to have a small thickness $t$ and a high net doping $N_s$ for region 1. Therefore, preferably the activator concentration of said opposite conductivity type in barrier region 1 is, for example, at least one or two orders of magnitude higher than the activator concentration of said one conductivity type in that region. Such a high concentration means that the barrier region 1 must also be very thin to remain depleted at zero bias. Typically barrier region 1 has a thickness of, for example, at most approximately 250 Å.

Figure 4:
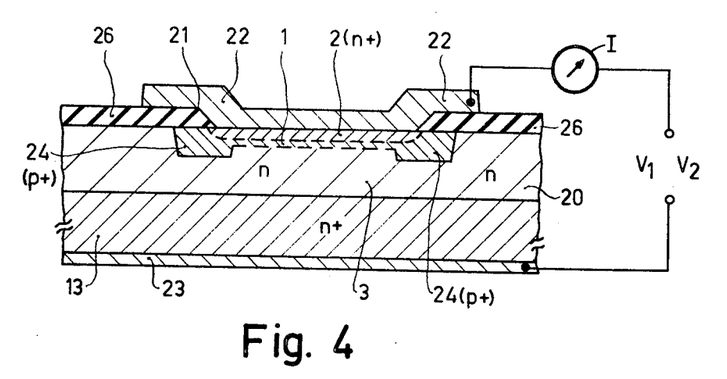
FIG. 4 is a cross-sectional view of a semiconductor body portion of a semiconductor diode in accordance with the present invention, and manufactured using the method according to the invention.

FIG. 4 illustrates one specific form of a diode structure in accordance with the present invention. The diode has an asymmetric current-voltage characteristic as a result of its first region 2 having a higher doping concentration of the one conductivity type than the second region 3. This diode is therefore of the general type illustrated by the potential diagram of FIG. 3. In this device, the first region 2 adjoins a surface of the semiconductor body 20 and is separated by the substantially depleted barrier region 1 from an underlying semiconductor body portion 3 which belongs to the second region of the diode. The surface-adjacent region 2 is therefore simply contacted by an electrode 22 provided on the semiconductor body surface. The region 2 is laterally bounded by an undepleted annular zone 24 of opposite conductivity type which extends sufficiently deeply in the body 20 to intersect the barrier region 1. The undepleted annular zone 24 acts as a guard ring similar to guard-rings used in known Schottky diode configurations. The zone 24 ensures that the region 2 is laterally separated from the surrounding part of region 3 and not short-circuited thereto at the edge of barrier region 1. As will be described hereinafter such an undepleted zone 24 may be formed during the same doping step as is used to form the depleted barrier region 1. However as will be described with reference to FIG. 4, zone 24 may have a doping which differs from that of said barrier region. This permits the doping and depth of the zone 24 to be chosen more independently so that zone 24 may form a higher barrier with region 3 than does barrier region 1.

The second region 3 of the diode shown in FIG. 4 is part of an epitaxial layer present on a more highly conductive substrate 13 which is also of the one conductivity type. The electrode connection 23 to the region 3 contacts the back surface of the substrate 13. In this manner a simple discrete diode structure with opposite electrodes 22 and 23 is formed.

The diode structure of FIG. 4 can be manufactured in the following manner also in accordance with the present invention. For the purpose of this example it will be assumed that the one conductivity type of the first and second regions 2 and 3 is n-type.

On a high conductivity n-type monocrystalline silicon substrate 13, an n-type silicon epitaxial layer 3 is grown in known manner. The epitaxial layer 3 may have a resistivity of typically 5 ohm-cm, for example, and a thickness of, for example, 12 microns. On the surface of the layer 3 a thermal oxide layer is grown in known manner for use as a dopant mask. Using known photolithographic and etching techniques annular windows are etched through the oxide layer where the annular zones 24 are to be provided in the epitaxial layer. It will be understood that generally many diodes are manufactured simultaneously in the same semiconductor wafer by effecting the processing at many locations on the wafer and subsequently dividing the wafer to provide separate semiconductor bodies for each semiconductor device. However for the sake of simplicity the manufacturing process will be described solely in terms of the processing effected at one such location.

After opening the annular window in the oxide mask, acceptor dopant is introduced into the epitaxial layer 3 to form the p+ annular zone 24 extending to a depth deeper than that at which the barrier region 1 will be formed. Such dopant may be introduced by known techniques, for example thermal diffusion of boron. After forming the zone 24, the whole dopant mask is removed, the surface of the epitaxial layer 3 is cleaned, and a fresh insulating layer 26 is provided in known manner. This layer 26 may be of, for example, thermally grown silicon oxide having a thickness of, for example, 1200 Å. By using known photolithographic and etching techniques, the insulating layer 26 is then provided with a window 21 which overlaps slightly the inner edge of the previously-provided p+ annular zone 24. Through the window 21 activator ions are implanted while using the layer 26 as an implantation mask to form a highly-doped n+ surface region 2 and a very thin highly doped but substantially depleted barrier region 1. Preferably the ion energy and mass are selected to make the region 1 as thin as possible (for example approximately 150 Å thick), and the ion dose is selected to make the region 1 as highly doped as possible. The ions for region 1 may be of a shallow-level acceptor to overcompensate the donor concentration of the substrate in the region 1. A suitably massive acceptor ion is indium at an ion beam energy of, for example 20 keV. This energy for indium ions will produce a maximum doping concentration for the potential barrier region at a depth of approximately 150 Å spaced from the silicon surface.

The region 2 is formed by a donor implant of, for example, 10 keV antimony ions which gives the region 2 a depth of approximately 100 Å. The donor dose used for the diode region 2 of FIG. 4 may overdope the inner edge of the p+ guard ring 24 where exposed at the window 21. Preferably the region 2 is implanted before the region 1 to reduce channelling of the implanted ions and so reduce the width of barrier region 1. For the same reason, the implantations are preferably effected at a small angle to the major semiconductor crystal axes.

The implantation to form regions 1 and 2 may be effected at room temperature with doses typically for example between $10^{13}$ and $10^{14}$ antimony ions/sq.cm. for region 2, and for example $5 \times 10^{12}$ to $5 \times 10^{13}$ indium ions/sq. cm. for region 1. Both implantations are subsequently annealed at, for example a temperature typically of 750° C. and in high vacuum, without the occurrence of any significant diffusion. The ion doses for the barrier region 1 are higher than the net values of $N_s$ suggested hereinbefore, since it is necessary to overdope both the epitaxial layer doping in region 1 and the donor dopant also in this region due to the implantation of region 2.

After annealing the implants, the n-type regions 2 and 3 are provided in known manner with electrode connections in the form of conductive layers 22 and 23 respectively. By providing the layers 22 and 23 which make a substantially ohmic connection to the regions 2 and 3, a majority carrier diode results. The electrodes 22 and 23 are typically of a metal, for example aluminium or titanium.

Figure 5:
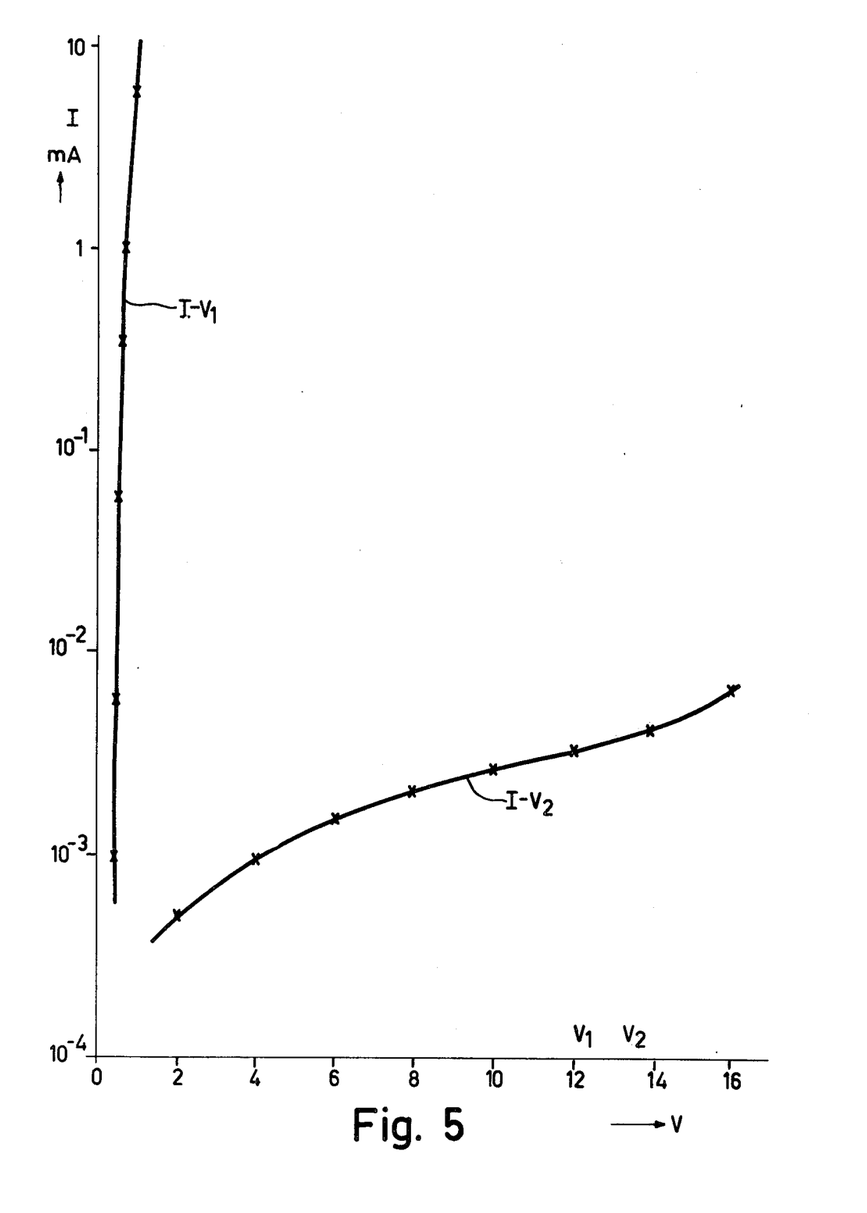
FIG. 5 shows the current/voltage characteristics of such a semiconductor diode as illustrated in FIG. 4.

FIG. 5 shows the current-voltage characteristics of such an asymmetric diode having the general structure shown in FIG. 4 and manufactured using such a method. The diode of FIG. 5 had an n-type epitaxial layer 3 of 4 ohm-cm. resistivity. The boron-diffused annular zone 24 was 0.5 microns deep and of circular symmetry with an inner diameter of 55 microns and an outer diameter of 90 microns. The window 21 in the oxide layer 26 was also circular with a diameter of 70 microns. The first region 2 was formed by an antimony implant dose of $5 \times 10^{13}$ ions/cm$^2$ at 10 keV. The barrier region 1 was formed by an indium implant dose of $1 \times 10^{13}$/cm$^2$ at 30 keV. The implantations were annealed together for 15 minutes at 750° C. in vacuo.

The current-voltage characteristics of FIG. 5 were measured by applying forward and reverse bias voltages $V_1$ and $V_2$ across the diode electrodes 22 and 23 as indicated in FIG. 4, and measuring the resulting current flow I. Under the forward bias condition $V_1$ the higher doped n-type region 2 is biased to a positive potential with respect to the less highly doped n-type region 3, and characteristic I-$V_1$ of FIG. 5 was obtained. Under reverse bias condition $V_2$ region 2 is biased negatively with respect to region 3, and the characteristic I-$V_2$ was obtained. The abscissa of the graph of FIG. 5 is the forward and reverse voltages $V_1$ and $V_2$ in volts, the ordinate of the graph is the current flow I through the diode in milliamps on a logarithmic scale. It can be seen from FIG. 5 that this majority-carrier diode in accordance with the present invention turns on under forward bias at a voltage below 1 volt, and that at 1 volt forward bias the current flow through the device is approaching 10 milliamps. At 1 volt reverse bias however the current flow through the diode is less than 1 microamp as shown in FIG. 5. Even at 15 volts reverse-bias the current flow is only approximately 5 microamps. Such a diode can be used as, for example, a rectifier.

In the diode of FIGS. 4 and 5, the whole of the barrier region 1 is substantially depleted of mobile charge carriers of both conductivity types at zero bias by the merging in barrier region 1 of the depletion layers, which barrier region 1 forms naturally with the first and second regions 2 and 3 of the diode. The diode of FIGS. 4 and 5 therefore has a sharp turn-on for its forward characteristic I-$V_1$ as shown in FIG. 5. If the whole of the barrier region were not substantially depleted of both types of charge carriers without any bias being applied, a device not in accordance with the present invention would be formed, and a softer current-voltage turn-on at a higher voltage would result, as well as a slower, switching speed, both of which can be measured. Thus, whether or not the barrier region 1 is substantially depleted as required can be detected from such measurements.

It will be obvious that many further modifications are possible within the scope of the present invention and that such first and second regions and barrier region can be used in many different device applications. Several such further modifications will now be described with reference to FIGS. 6 to 10. Those portions of these devices which are similar to those of the devices of FIGS. 3 and 4 will be designated by the same references.

Figure 6:
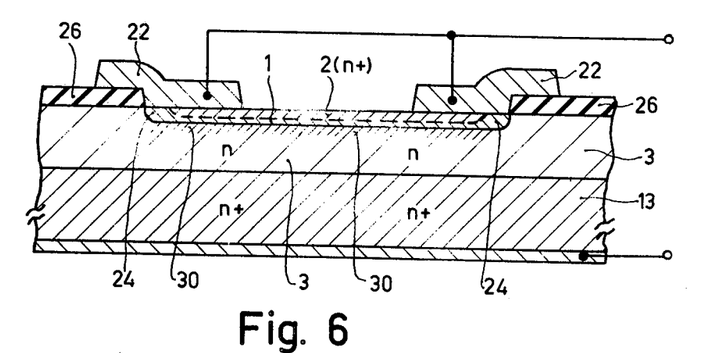
FIG. 6 is a cross-sectional view of a semiconductor body portion of another semiconductor diode in accordance with the present invention, and manufactured using the method according to the invention.

In the device illustrated in FIG. 6, the annular zone 24 has been formed during the same doping step as was used to form the depleted barrier region 1. The advantage of such a feature is that the number of processing steps needed for the manufacture is significantly reduced and a very compact device structure can be formed. This can be achieved in the following manner. After depositing the epitaxial layer 3, thermally grown silicon oxide layer 26 is provided for example to a thickness of 1500 Å. Window 21 corresponding to the outline of the required first region 2 is then provided in layer 26 and ions for forming the first region 2 are implanted at the window 21 using the layer 26 as an implantation mask. The device structure is then subjected to a dip-etch in, for example, dilute hydrofluoric acid to etch away about, for example, 400 Å of the layer 26. This dip-etch therefore slightly widens the window 21. The widened window 21 is subsequently used as an implantation window for the barrier region implant which extends to the surface around the region 2 implant. The widened window 21 may also be used as a contact window for the electrode 22 contacting the first region 2; in this case electrode 22 also contacts the annular zone 24. The etch-widening of the window 21 and hence the width of the resulting annular zone 24 may be made sufficiently small that this zone 24 is also substantially depleted. However, a wide zone 24 formed during the barrier region implant is not fully depleted and so behaves similar to the diffused p-type zone 24 in the device of FIG. 4. If desired, a further insulating layer may be deposited in the enlarged window 21 either before or after the barrier region implant, and a contact window may be subsequently provided in this further layer so as to expose only the region 2 for contacting by the electrode 22.

Another modification illustrated in FIG. 6 is the inclusion of a doping concentration 30 in the second region 3 in the depletion layer formed with said barrier region 1. The doping concentration 30 is higher than that in the underlying bulk of said region 3. Such an increased doping concentration 30 can readily be formed by ion implanting in region 3 dopant ions which are of the same conductivity type as region 3, the implantation being effected at such an energy that these ions have a range in the semiconductor body slightly further than that of the ions in the barrier region implant. If the doping concentration 30 is located at least mainly within the zero-bias depletion layer which extends into region 3 from barrier region 1 there is a negligible effect on the asymmetric doping of regions 2 and 3. The doping concentration 30 is therefore preferably provided within approximately 150 Å of barrier region 1. Such a locally increased doping concentration 30 serves to increase the magnitude of the electric field in the region 3 adjacent the barrier region 1. As a result, the fall-off of the potential curve in region 3 shown in the potential diagram of FIG. 3 becomes steeper, and carriers will more readily pass over the potential barrier between regions 2 and 3. A typical donor ion dose for forming the doping concentration 30 may be, for example, between 2 and $5 \times 10^{12}$ arsenic ions/cm$^2$.

FIG. 6 also illustrates a further modification in which the electrode 22 which contacts the first zone 2 is apertured. In this manner a window for photon radiation may be provided over the major portion of the first region 2. The elctrode connection 22 shown in FIG. 5 is annular and contacts the periphery of region 2. Such a device structure may be used as a low photon level detector with high quantum efficiency and gain for detecting photon radiation incident through the electrode window. Minority carriers generated by the radiation may collect in the barrier region 1 thereby modulating the barrier height and the magnitude of the majority carrier current flow across the barrier. The electrode layer 22 may be for example highly-doped polycrystalline silicon or a metal.

The barrier region 1 and the first and second regions 2 and 3 can readily be integrated with other semiconductor regions and electrodes to form more complex semiconductor devices.

Figure 7:
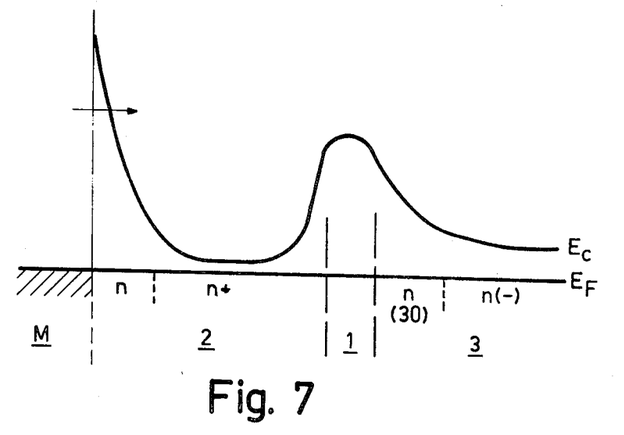
FIG. 7 is a potential diagram of a transistor in accordance with the present invention.

An interesting majority carrier (unipolar) transistor structure results when the region 2 is additionally contacted by a Schottky metal contact M (FIG. 7). The Schottky contact acts as the emitter and injects electrons into the n-type region 2; this of course requires the Schottky contact to be operated under reverse bias. The n-type region 2 acts as the base and is provided with an ohmic contact 22 (the base contact) in addition to the Schottky contact M. The n-type region 3 acts as the collector. It should be noted that in the base (region 2) of such a transistor structure the current is carried by majority charge carriers, i.e., electrons in an n-type region 2. The emitter barrier (Schottky barrier) should be chosen to be higher than the barrier of the barrier region 1. The energy band diagram of such a transistor is shown in FIG. 7. The energy of the majority carriers which carry the current in the base 2 between the emitter and collector is significantly higher than the Fermi energy so that such a transistor may be termed a "hot-electron transistor".

Different forms of hot-electron transistor have been previously proposed over many years but without producing a commercially feasible transistor. In this connection reference is invited to, for example, pages 587 to 615 of the book by S. M. Sze entitled "The Physics of Semiconductor Devices" and published by Wiley Interscience, copyright 1969, which pages are hereby incorporated by reference into the present specification. Previously proposed forms of hot-electron transistors have consisted basically of alternating layers of metal and insulator or semiconductor and some have included Schottky-barriers. Such previously proposed devices have been technologically difficult to manufacture. Generally the base region has been formed by a thin sandwiched metal layer. Interface problems have occurred between the different materials. The charge-carriers have to traverse a number of interfaces between different materials and through semiconductor and/or dielectric materials of different energy band gaps combind in a common device structure. This has resulted in poor carrier transport and poor emitter and collector efficiency.

The present invention, however, permits the fabrication of a hot-electron transistor in which, as illustrated in FIG. 7, the base region is a semiconductor region 2 and the barriers are formed in the same semiconductor body. Such hot-electron transistors may have negligible minority carrier storage effects in both emitter and base and therefore be suitable for use at a fast speed or high frequency. They may also have a low base resistance by choosing a high doping concentration of the one conductivity type for the base region 2, and may be relatively insensitive to inhomogeneities in base doping. Therefore, such transistors may have significant advantages compared with conventional bipolar transistors of the n-p-n or p-n-p type.

Figure 8:
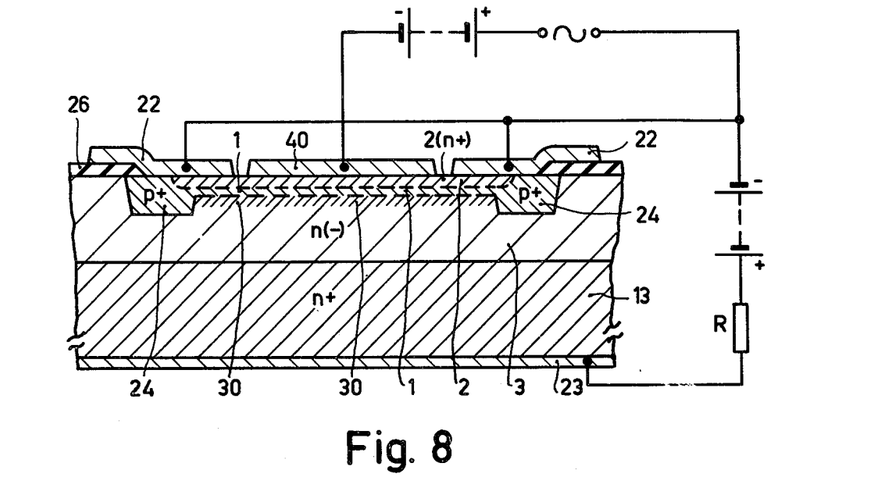
FIG. 8 is a cross-sectional view of a semiconductor body portion of such a transistor as illustrated in FIG. 7.

FIG. 8 illustrates one specific form of such a hot-electron transistor in accordance with the present invention. The first region 2 has a high doping of one conductivity type (for example n-type) and forms the base region of the transistor. The emitter-base junction is formed with region 2 by barrier-forming means which in the form shown in FIG. 8 comprise a Schottky electrode 40 of for example gold or nickel which contacts part of the region 2 to form the Schottky barrier. The base contact is formed by the electrode connection 22 to the region 2. The collector region of the transistor is formed by the second region 3 of the one conductivity type and as described previously region 3 may be an epitaxial layer. The collector contact 23 of the transistor shown in FIG. 8 contacts the back surface of the highly doped substrate 13 also of the one conductivity type on which the epitaxial layer is provided. A high doping concentration 30 of the one conductivity type may also be included in the collector region 3 adjacent the barrier region 1. The substantially depleted barrier region 1 forms the base-collector barrier of the transistor.

During operation, the emitter electrode 40 is biased negatively with respect to the n-type base 2 which is itself biased negatively with respect to the collector electrode 23. The base and collector electrode connections 22 and 23 serve for applying the reverse bias voltage across the substantially-depleted barrier region 1. The emitter and collector electrodes define the main current path in the device which extends through the first region 2 and the barrier region 1 to the second region 3. As indicated in FIG. 8, an a.c. input signal can be applied between the emitter and base electrodes 40 and 22, and an amplified output signal can be derived across a load R between the base and collector electrodes 22 and 23.

In a presently preferred form, the doping concentration of said first (base) region 2 below said Schottky electrode 40 has a maximum value spaced from the surface. This can be achieved by using higher ion energies for the implants. With reverse-bias conditions such a spacing introduces a potential drop between the emitter and the undepleted portion of base region 2 so that the potential of the collector barrier region 1 is shifted to lower potentials with respect to the emitter as reverse bias is increased. In this way an energy distribution is obtained which aids collector efficiency at the barrier region 1. Such a spacing is indicated in FIG. 7 by the n and n+ symbols in region 2. The higher doping concentration 30 locally provided in the bulk of region 3 is also indicated in FIG. 7 by the n and n(−) symbols in region 3, the n(−) symbol representing the bulk doping of region 3. This locally provided doping concentration 30 also aids collector efficiency in a manner similar to that previously described with reference to FIG. 6.

Figure 9:
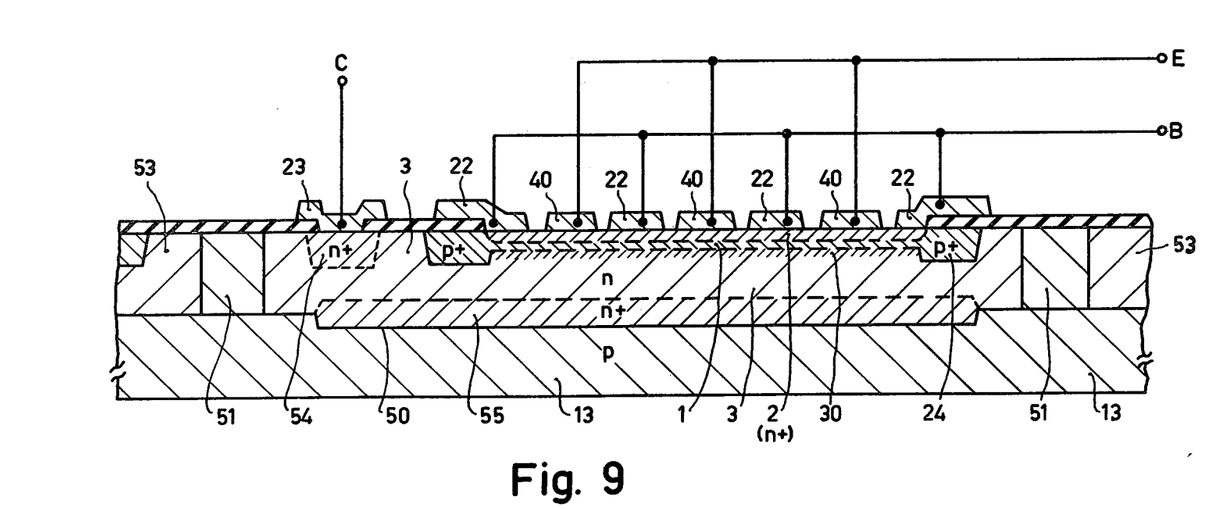
FIG. 9 is a cross-sectional view of a semiconductor body portion of an integrated circuit in accordance with the invention and FIG. 10 is a potential diagram of a further transistor in accordance with the invention.

FIG. 9 illustrates part of an integrated circuit comprising a hot-electron transistor in accordance with the present invention. In this example, the second region 3 is formed by an island part of an epitaxial layer which is of the one conductivity type (for example n-type) and is present on a substrate 13 of the opposite conductivity type. The island 4 is electrically isolated in known manner from other island parts 53 of the epitaxial layer by the p-n junction 5 between the islands and the substrate 13 and by the isolation walls 51 which laterally bound the islands. As is known in the integrated circuit art, such isolation walls may be formed by for example diffusion of dopant of the opposite conductivity type locally through the epitaxial layer thickness and/or by insulating material which may be provided by, for example, local oxidation of the epitaxial layer. After forming the separate islands the hot-electron transistor is formed in island 3, and other circuit elements are formed in the other islands 53. The various circuit elements are connected in the same integrated circuit by means of the electrode connections at the surface of the epitaxial layer. The circuit may be for example a logic circuit.

In the FIG. 9 embodiment, the collector electrode connection 23 of the transistor contacts the surface of the island part 3. In order to reduce the collector series resistance a more-highly doped surface contact zone 54 and buried layer 55 both of the one conductivity type may be provided in known manner, as shown in FIG. 9.

The hot-electron transistor in FIG. 9 also differs from that in FIG. 8 in that a plurality of emitter-base barriers are formed with said first region 2, so reducing the base resistance. This multi-emitter structure is achieved by a plurality of Schottky contacts 40 which may be for example interdigitated with a plurality of base contacts 22.

As previously described, an annular zone 24 of a hot-electron transistor in accordance with the present invention need not have a different depth and doping to that of the substantially depleted barrier region 1, but may be formed during the doping step used to form the barrier region 1.

Figure 10:
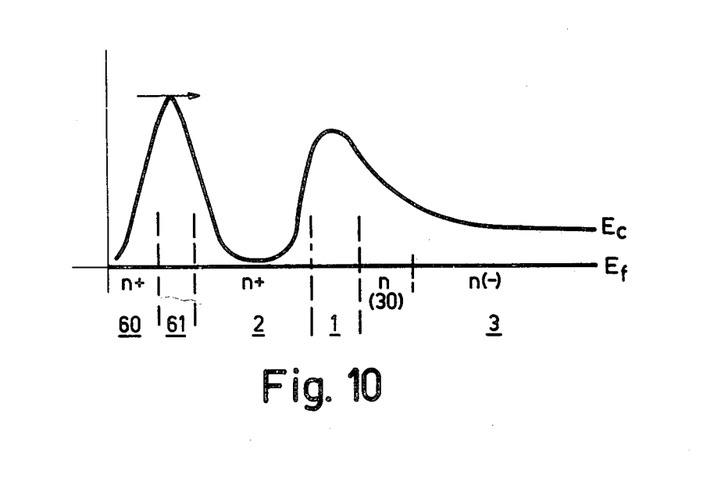

FIG. 10 is the potential diagram of a further hot-electron transistor in accordance with the present invention. Instead of a Schottky electrode, this transistor has a third region 60 which is of the same one conductivity type as region 2 (for example n-type) and forms the emitter of the transistor. Region 60 is separated from the underlying first region 2 by a barrier region 61 which forms the emitter-base junction. This emitter-base barrier region 61 is a semiconductor region having an impurity concentration characteristic of the opposite conductivity type which is higher than doping of said one conductivity type in said barrier region so as to provide barriers to the flow of charge carriers of the one conductivity type from both the first and third regions 2 and 60 and to form depletion layers at zero bias with both the first and third regions 2 and 60. The emitter-base barrier region 61 is sufficiently thin that said depletion layers formed at zero bias with both said first and third regions 2 and 60 merge together in said barrier region 61 to substantially deplete at zero bias the whole of said barrier region 61 of mobile charge carriers of both said one and opposite conductivity types. Thus such a transistor has substantially depleted barrier regions 61 and 1 forming both the emitter-base and collector-base barriers, and the emitter, base and collector regions 60, 2 and 3 are all of the same conductivity type. The regions 61 and 60 may of course be formed by ion implantation.

The manner of manufacture for specific forms of hot-electron transistors of the types illustrated in FIGS. 7 to 10 and in particular the dopants, doping concentrations and thicknesses of their barrier region 1 and first and second regions 2 and 3 can be similar to those described for the diode structures of FIGS. 3 to 6. Thus, for example, the electrode 22 of the device of FIG. 4 may be apertured and the devices of both FIGS. 4 and 6 may include a Schottky contact to the region 2 within the aperture in the electrode 22, thereby converting these structures into hot-electron transistors.

It will be appreciated that hot-electron transistors in accordance with the present invention may be formed and used in an inverted sense so that the first and second regions 2 and 3 form respectively the base and emitter regions, and the substantially depleted barrier region 1 therebetween forms the emitter-base barrier.

It will be evident that many more modifications and applications are possible within the scope of the present invention. Although ion implantation has been mentioned as particularly convenient for forming the narrow substantially depleted barrier region 1 and, for example, the highly doped first region 2, other known techniques are also possible. Thus, for example molecular beam epitaxy would be suitable for forming such thin doped regions with for example a III-V semiconductor material such as gallium arsenide. The lateral dimensions of regions grown by molecular beam epitaxy may be defind by subsequent localized processing, for example localized etch removal, localized overdoping, or the formation of semi-insulating zones using localized proton bombardment.

It will be evident that devices with opposite conductivity types can be provided in accordance with the invention. Thus, for example the first and second regions 2 and 3 may be p-type and the impurity concentration of the barrier region 1 may be formed by donor levels. It will also be evident that electrodes which serve for applying a bias voltage across the barrier region 1 between the first and second regions 2 and 3 and for defining in a semiconductor device a current path which extends between the first and second regions 2 and 3 through the barrier region 1 need not directly contact the regions 2 and 3 but may be indirectly connected thereto via further semiconductor regions or even further circuit elements of the device, depending on the particular device structure.

What is claimed is:

1. A semiconductor device comprising a semiconductor body including first and second semiconductor regions of one conductivity type separated by a barrier region having a net activator concentration of the opposite conductivity type, means for providing a current path in said body between said first and second regions across said barrier regions, the current flow through said barrier region being by charge carriers of said one conductivity type, said first region having a higher doping concentration of the one conductivity type than the second region, said barrier region being sufficiently thin that the depletion layers formed at zero bias with both said first and second regions merge together in said barrier region to substantially deplete at zero bias the whole of said barrier region of mobile charge carriers of both said one and opposite conductivity types.

2. A semiconductor device as in claim 1, wherein said barrier region is a semiconductor region doped with activator atoms of said opposite conductivity type.

3. A semiconductor device as in claim 2, wherein said barrier region has a concentration of activators of said opposite conductivity type that is at least two orders of magnitude higher than that of activators of said one conductivity type.

4. A semiconductor device as in claim 1, wherein said first region adjoins a surface of the semiconductor body and is separated by the barrier region from an underlying semiconductor body portion which comprises said second region.

5. A semiconductor device as in claim 4, wherein said surface-adjoining first region is laterally bounded by an undepleted annular zone of said opposite conductivity type, which said annular zone laterally separates said first region from part of said second region and extends sufficiently deeply in the body to intersect said barrier region.

6. A semiconductor device as in claim 5, wherein said undepleted annular zone has a doping which differs from that of said barrier region.

7. A semiconductor device as in claim 1, wherein said means for providing said current path comprise a first electrode connection which contacts said first region and a second electrode connection to said second region.

8. A semiconductor device as in claim 1, wherein said first, second, and barrier regions together form a diode the current flow through which is by majority carriers.

9. A semiconductor device as in claim 1, comprising barrier-forming means that forms a potential barrier with said first region, said first region forming the base region of a transistor that comprises emitter-base and base-collector potential barriers, said emitter-base and base-collector barriers of said transistor being provided by said barrier-forming means and said barrier region respectively, the current flow through said transistor being by majority carriers.

10. A semiconductor device as in claim 9, wherein said barrier forming means comprise a Schottky electrode which contacts part of said first region and forms the emitter of said transistor.

11. A semiconductor device as in claim 10, wherein the doping concentration of said first region below said Schottky electrode has a maximum value at a distance from the surface.

12. A semiconductor device as in claim 9, wherein said body comprises a third region of said one conductivity type that forms the emitter of said transistor and is separated from the underlying first region by a barrier region which forms the emitter-base potential barrier, said emitter-base barrier region being a semiconductor region having said opposite conductivity type impurity concentration which is higher than the doping level of said one conductivity type in said barrier region so as to provide potential barriers to the flow of charge carriers of the one conductivity type from both the first and third regions and to form depletion layers at zero bias with both of said first and third regions, and emitter-base barrier region being sufficiently thin that said depletion layers formed at zero bias with both said first and third regions merge together in said barrier region to substantially deplete at zero bias the whole of said barrier region of mobile charge carriers of both said one and the opposite conductivity types.

13. A semiconductor device as in claim 9, wherein said transistor comprises a plurality of emitter-base barriers formed with said first region.

14. A semiconductor device as in claim 1, wherein said second region has a higher doping concentration in the depletion layer formed with said barrier region than in the underlying bulk of said second region.

15. A semiconductor device as in claim 1, wherein said second region comprises part of an epitaxial layer one conductivity type which is present on a more highly conductive substrate of said one conductivity type, and an electrode connection to said second region contacts said substrate.

16. A semiconductor device as in claim 1, wherein said second region comprises part of an epitaxial layer one conductivity type which is present on a substrate of the opposite conductivity type, and an electrode connection to said second region contacts the surface of said epitaxial layer part.

* * * * *